United States Patent [19]

Tando

[11] 4,353,481
[45] Oct. 12, 1982

[54] MAGAZINE FOR STORING AND SUPPLYING CIRCUIT ELEMENTS

[75] Inventor: Shuichi Tando, Tokyo, Japan

[73] Assignee: Tokyo Denki Kagaku Kogyo Kabushiki Kaisha, Japan

[21] Appl. No.: 198,232

[22] Filed: Oct. 17, 1980

[30] Foreign Application Priority Data

Oct. 23, 1979 [JP] Japan .............. 54-145893[U]
Oct. 23, 1979 [JP] Japan .............. 54-145894[U]

[51] Int. Cl.³ .............. G07F 11/16; B65D 85/62; B65D 83/00
[52] U.S. Cl. .............. 221/251; 206/328; 206/499; 221/307; 312/60
[58] Field of Search .............. 206/328, 331, 499; 221/307, 229, 251; 312/60

[56] References Cited

U.S. PATENT DOCUMENTS

| | | | |
|---|---|---|---|
| 2,431,121 | 11/1947 | Hunter | 221/307 |
| 3,454,154 | 7/1969 | Peters et al. | 206/331 |
| 4,043,485 | 8/1977 | Tippetts | 312/60 |
| 4,172,523 | 10/1979 | Weglage | 221/307 |

*Primary Examiner*—William T. Dixson, Jr.
*Attorney, Agent, or Firm*—Steinberg & Raskin

[57] ABSTRACT

Magazine for storing and supplying chip type circuit elements includes a tube having a bore formed therethrough in which the circuit elements are situated in stacked relationship for feeding toward an open supply end and wherein an elastic member is provided on the tube in the region of the supply end having a surface facing inwardly into the bore and wherein a keeper pawl extends inwardly from the free end of the elastic member into the bore at the supply end region, preferably slightly below the supply end, adapted to hold the leading circuit element under pressure prior to the same being supplied in one-by-one fashion and to prevent simultaneous supply of more than one circuit element from the supply end of the magazine and, additionally, to precisely locate each circuit element at the supply end. In one embodiment, longitudinally extending ribs protruding inwardly into the bore are formed on the bore defining surface of the tube which maintain the chip elements in precise mutual alignment.

5 Claims, 13 Drawing Figures

FIG. 1    FIG. 2
FIG. 3
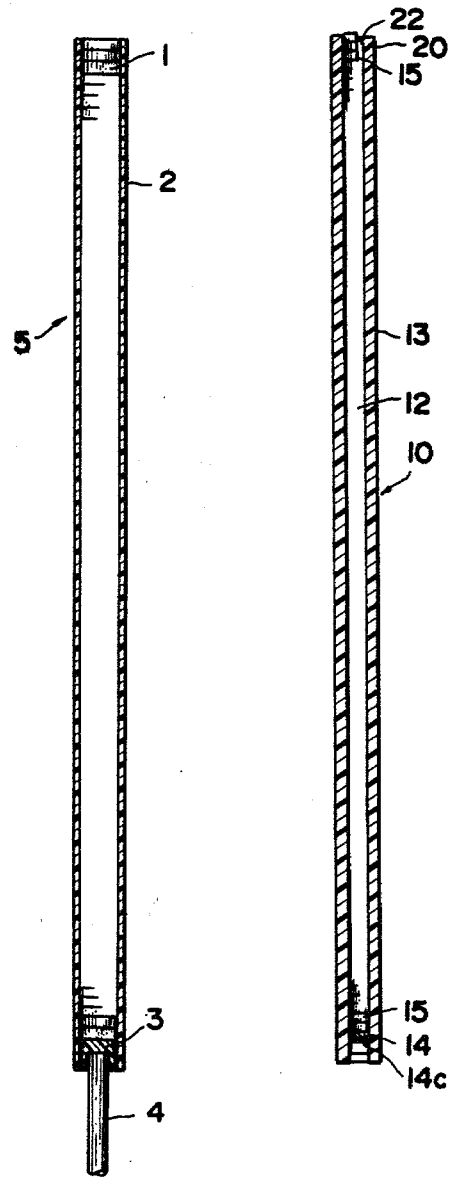
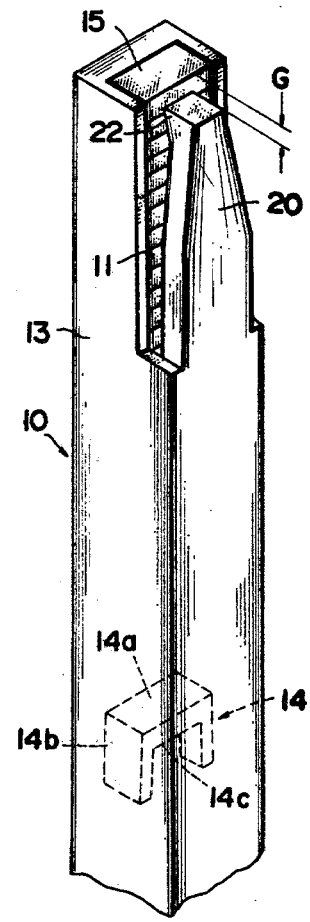

MAGAZINE FOR STORING AND SUPPLYING CIRCUIT ELEMENTS

BACKGROUND OF THE INVENTION

This invention relates to a magazine for storing chip type circuit elements of the type having no leads, such as chip capacitors, in a stacked condition, and for supplying such circuit elements in a one-by-one fashion.

Recently, the miniaturizaton of circuit elements has progressed significantly, and small sized circuit elements of the type having no leads, such as chip capacitors (also called "laminated capacitors"), have come into extensive use. Chip type circuit elements of this type have extraordinarily small outer dimensions. For example, a typical chip capacitor may have dimensions of about 3.2 mm (in length)×1.6 mm (in breadth)×0.6 mm (in thickness). It is therefore quite difficult to store or transport a large number of such chip capacitors in a predetermined arrangement. In addition, it is extremely inefficient to manually mount such circuit elements one-by-one on printed circuit boards as is done in the case of conventional circuit elements of larger sizes.

Accordingly, a magazine for storing and supplying circuit elements has recently been proposed in order to facilitate the storage, transportation and mounting of such chip type circuit elements on printed circuit boards.

Referring to FIG. 1, a known magazine 5 is illustrated. The magazine 5 has a structure wherein chip type circuit elements 1 are stored in a stacked arrangement and supported by a plug member 3 within a rectangular tube 2 which has a longitudinally extending bore whose transverse cross-section substantially conforms to the external shape of the chip type circuit element 1. In this case, the supply of the chip type circuit elements 1 is effected by pushing the plug member 3 by means of a thrust pin 4.

The illustrated prior art magazine 5 for storing and supplying the circuit elements, however, does not have the capability of separating the chip type circuit elements 1 individually and, accordingly, its use gives rise to a problem discussed below. By way of example, a chip capacitor has a light weight, typically on the order of 20 mg. For this reason, when a circuit element 1 such as the chip capacitor is to be supplied from the magazine 5, it is not uncommon for two circuit elements 1 adhered to each other to be discharged from the magazine upon pushing out the stack of the circuit elements by means of the thrust pin 4.

SUMMARY OF THE INVENTION

It is therefore an object of this invention to solve the problem described above and to provide a magazine for storing and supplying circuit elements wherein the chip type circuit elements are reliably supplied in a one-by-one fashion.

According to one embodiment of the invention, a magazine for storing and supplying circuit elements comprises an elastic member which is provided in the region of the supply end of a rectangular tube for storing the circuit elements in a stacked condition, and a keeper pawl formed at a free end of the elastic member in order to hold the leading one of the stacked circuit elements under pressure. When the leading circuit element is supplied, the succeeding circuit element is reliably held by the pawl so that the two adjacent circuit elements are prevented from being delivered simultaneously.

BRIEF DESCRIPTION OF THE DRAWINGS

A more complete appreciation of the present invention and many of the attendant advantages thereof will be better understood by reference to the following detailed description when considered in connection with the drawings in which:

FIG. 1 is a front sectional view illustrating a prior-art magazine for storing and supplying circuit elements;

FIG. 2 is a vertical sectional view illustrating the general construction of one embodiment of a magazine for storing and supplying circuit elements according to the present invention;

FIG. 3 is a perspective view illustrating in detail the construction of the supply end region of the embodiment of FIG. 2;

DESCRIPTION OF THE PREFERRED EMBODIMENTS

Figure 4:
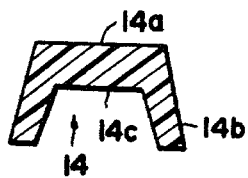
FIG. 4 is a front sectional view of a plug member for use in the embodiment of FIG. 2.

Referring now to the drawings wherein like reference characters designate identical or corresponding parts throughout the several views, and more particularly to FIGS. 2 and 3, one embodiment of a magazine 10 for storing and supplying circuit elements according to the present invention is illustrated and comprises a tube 13 having a bore 12 of rectangular cross-section formed therethrough and whose external shape is that of a regular square prism. A plug member 14 is movably situated in the bore 12. The magazine 10 holds the chip type circuit elements 15 within the bore 12 in a stacked arrangement supported on the plug member 14 which abuts the trailing circuit element 15.

As best seen in FIG. 4, the plug member 14 includes a platform portion 14a which serves to support the chip type circuit elements 15 in the stacked condition, and engaging portions 14b which elastically engage the inner bore defining surfaces of the tube 13 and which serve to prevent the plug member 14 from falling under its own weight. A recess 14c is defined under the platform portion 14a, and a thrust pin 23 engages the recess 14c so as to push the plug member 14 upwards.

At the upper supply, i.e., discharge end region of the tube 13, an elastic member 20 (best seen in FIG. 3) is formed integrally with the body of the tube in a manner such that the elastic member 20 is located on one side of the rectangular bore separated from the other three sides by slits 11 and so that the inner surface of the elastic member forms one of the four surfaces defining the bore 12. The free end of the elastic member 20 is formed with a keeper pawl 22 which protrudes inwardly into the bore. The fore end of the pawl 22 is situated below the plane of the supply or upper end of the tube 13 by an amount G (FIG. 3), which is preferably slightly smaller than the thickness of a single chip type circuit element 15. The tube 13 is fabricated by, for example, the injection molding of an A.B.S. (acrylonitrile butadiene styrene) resin, while the plug member 14 is formed from an elastic resin such, for example, as acetal resin or styrol resin.

Figure 5:
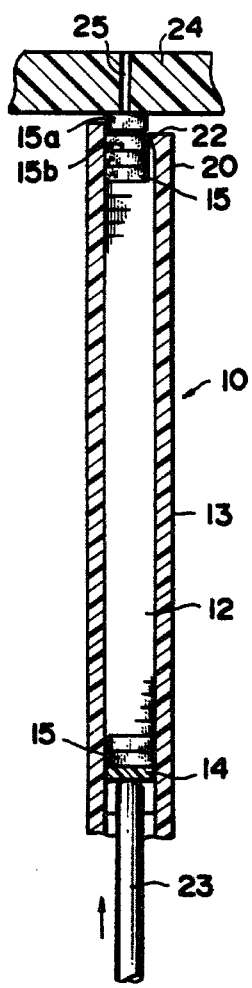
FIG. 5 is a vertical sectional view illustrating the operation of the embodiment of FIG. 2 wherein a circuit element is being drawn out of the magazine under suction.
Figure 6:
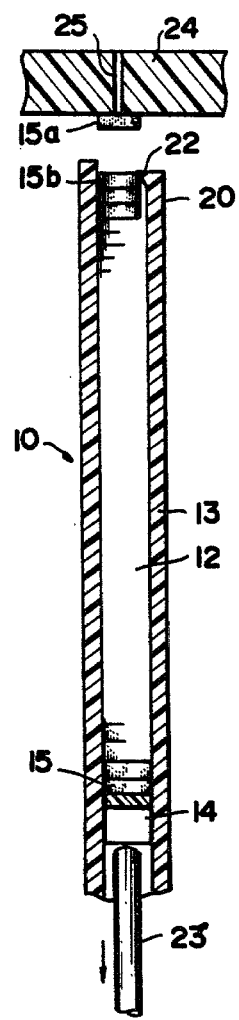
FIG. 6 is a vertical sectional view similar to FIG. 5 wherein the circuit element has been drawn out.

In the above embodiment, the mounting of the chip type circuit element 15 on a printed circuit board is carried out as follows by way of example. As shown in FIG. 5, the plug member 14 is urged upwardly by the thrust pin 23 and, simultaneously, a suction plate 24 is caused to abut on the upper opening of the bore 12. At this time, suction is applied to a suction port 25 whereupon the leading chip type circuit element 15a is removed from the upper discharge end of the magazine under suction. With the circuit element 15a adhered to the bottom surface of the suction plate 24, the latter is moved upwardly (FIG. 6) and shifted to the desired position over the printed circuit board.

In the illustrated embodiment, the keeper pawl 22 is formed at the free end of the inner surface of the elastic member 20, and the fore end of the keeper pawl 22 is lower than the end face of tube 13 by a distance G. Therefore, when the chip type circuit element 15a of the uppermost stage is drawn under suction, the next successive chip type circuit 15b is reliably held by the keeper pawl 22 of the elastic member 20, and hence, the situation in which the two chip type circuit elements are simultaneously drawn under suction and shifted in a stacked condition is prevented from occurring.

An additional important advantage is obtained by the present invention as described above. As seen in the figures, the keeper pawl 22 is partially defined by a surface which extends upwardly and inwardly within the bore 12. Thus, as the stacked circuit elements are urged upwardly in bore 12 by plug member 14, the leading circuit element will engage the angled pawl surface and therefore be urged against the opposite inner bore surface (reference surface) of the tube 13. In this manner, any possibility of the chip type circuit element 15b rotating due to clearances between it and the bore is eliminated, and, therefore, the circuit element is prevented from being drawn under suction in a turned or shifted state. This permits an extremely precise positioning of the circuit element and eliminates any deviation in the mounting position of the component on the printed circuit board.

As set forth above, in the magazine for storing and supplying circuit elements according to the present embodiment, the elastic member is integrally formed at the upper end or supply region of the rectangular tube, and the keeper pawl is formed at the free end of the elastic member. The embodiment therefore provides two distinct and important advantages, namely, the prevention of two circuit elements being simultaneously drawn under suction and, additionally, the elimination of any shifting of the circuit element as it is supplied from the magazine.

Now, another embodiment of the present invention will be described. According to this embodiment, it is possible to supply chip type circuit elements in a one-by-one fashion in a smoother manner than has been possible heretofore.

Figure 7:
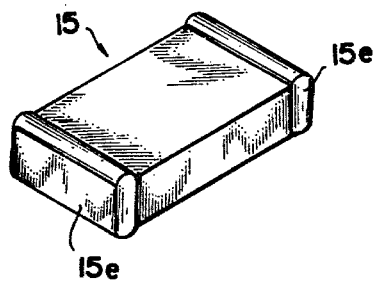
FIG. 7 is a perspective view illustrating a type of chip type circuit element.
Figure 8:
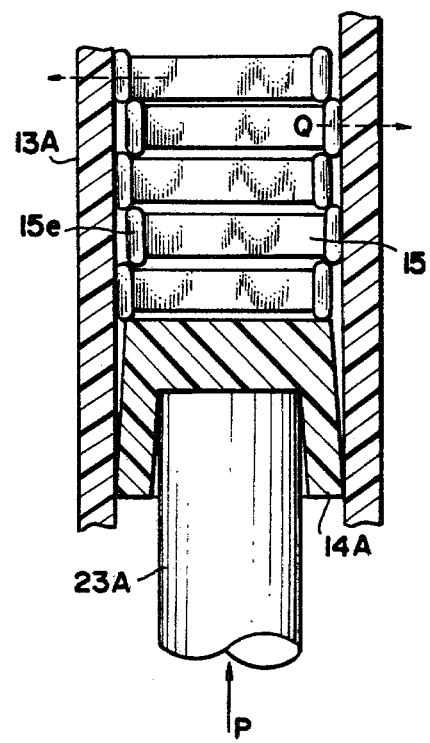
FIG. 8 is an enlarged sectional view showing the interior of a magazine for storing and supplying circuit elements as shown in FIG. 7.

As seen in FIG. 7, a typical chip type circuit element 15 has electrodes 15e at opposed end parts. Since the parts of the electrodes 15e bulge beyond the major surfaces of the chip type circuit elements 15 and the latter generally deviate in their total lengths, the stack of the chip type circuit elements 15 is prone to zigzag within the bore of a tube 13A as illustrated in FIG. 8. In other words, due to the bulging electrodes, the chip type circuit elements 15 tend to overlap one another in a manner such that the electrodes 15e completely shift from one another, so that the circuit elements 15 function as wedges whereby when a plug member 14A is moved in the direction of arrow P by a thrust pin 23A, forces directed toward the inside walls of the rectangular tube 13A act on the chip type circuit elements 15 as indicated by arrows Q. This results in an uneven supply of the circuit elements and in the worst case, the chip type circuit elements 15 can seize and become immovable within the rectangular tube 13A.

The present embodiment eliminates the drawback described above and provides a magazine for storing and supplying circuit elements wherein the chip type circuit elements are supplied in a uniformly smooth manner in one-by-one fashion.

Hereunder, the embodiment will be described with reference to the drawings.

Figure 9:
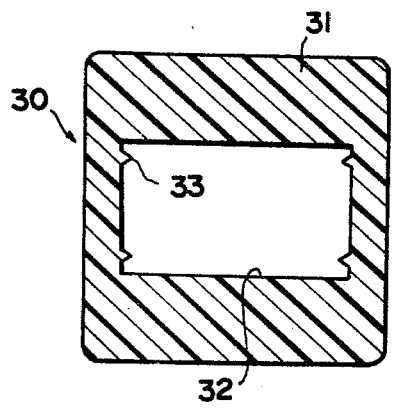
FIG. 9 is a transverse sectional view illustrating another embodiment of the magazine for storing and supplying circuit elements according to the present invention.
Figure 10:
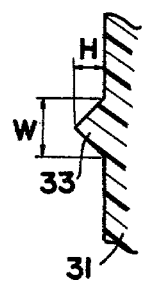
FIG. 10 is an enlarged sectional view illustrating in detail a feature of the embodiment of FIG. 9.

Referring to FIG. 9, a rectangular tube 31 of a magazine 30 for storing and supplying circuit elements has a bore 32 whose dimensions are slightly larger than the outer dimensions of the chip type circuit elements 15 in the same manner as in the previously described embodiment. A pair of inwardly protruding ribs 33 extending continuously in the vertical or longitudinal direction, are formed on each of the two shorter opposing surfaces of the bore 32, i.e., those surfaces which are spaced from each other at a greater distance than the other pair of surfaces. These protruding ribs 33 are formed integrally with the rectangular tube 31 so as to have a pliability or flexibility when the latter is molded from A.B.S. resin or the like. Referring to FIG. 10, each rib 33 preferably has an angled cross section. Although the dimensions of the ribs 33 are partially determined by the magnitudes of the dimensional deviations of the chip type circuit elements 15, they generally are approximately 50 microns in height H and 100 microns in width W as indicated in FIG. 10 when the outside dimensions of the rectangular tube 31 are on the order of about 4.5 mm×4.5 mm. The remaining construction of the magazine 30 is preferably the same as in the case of the first embodiment described before, and is therefore omitted from the description. However, it is understood that the features of this embodiment can be incorporated in other magazines.

Figure 11:
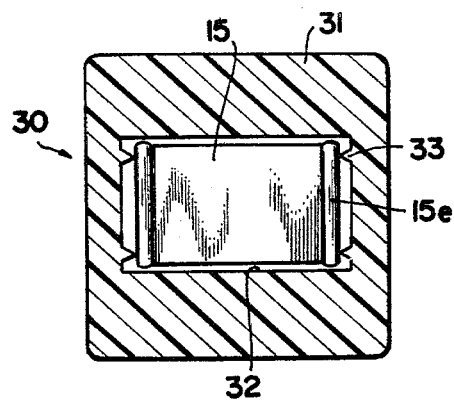
FIG. 11 is a transverse sectional view of the embodiment of FIG. 9 and illustrating the chip type circuit elements of FIG. 7 stored therein.
Figure 12:
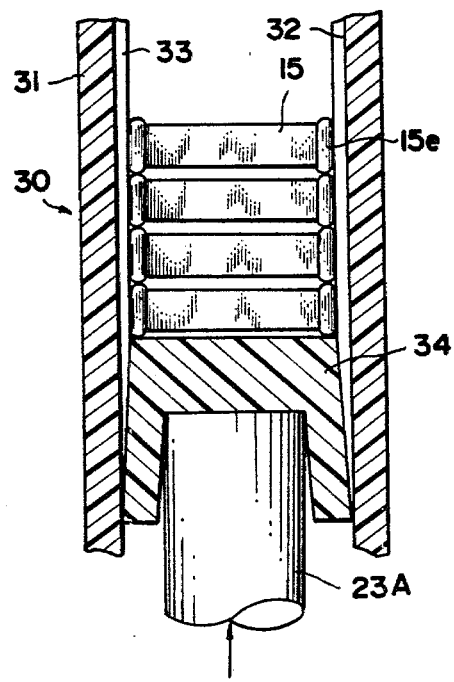
FIG. 12 is a front sectional view of the apparatus illustrated in FIG. 11.

In the construction of the second embodiment, if the lengthwise dimensions of the chip type circuit elements 15 are normal, the circuit elements 15 lie in contact with the tips of the ribs 33 so that the same are guided through the bore in precise mutual alignment so as to be prevented from zig-zagging as seen from FIGS. 11 and 12. Owing to the line contact between ribs 33 and circuit elements 15 the slide resistance of the chip type circuit elements 15 with respect to the rectangular tube 31 is significantly reduced relative to conventional magazines, and the chip type circuit elements 15 will be smoothly delivered in a uniform manner and supplied from the upper opening of the rectangular tube 31 one-by-one by pushing up plug member 34 by means of the thrust pin 23A.

Figure 13:
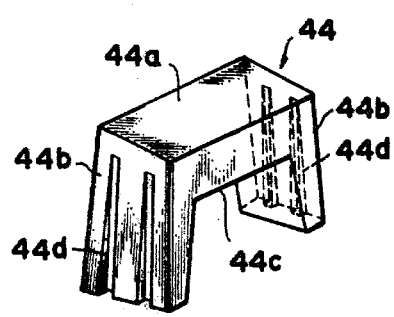
FIG. 13 is a perspective view showing a modified embodiment of the plug member for use in the embodiment of FIG. 9.

An even smoother delivery and supply of the chip type circuit elements 15 through magazine 30 is obtained through the use of a plug member as shown in FIG. 13. The plug member 44 as shown in FIG. 13 comprises a platform portion 44a which serves to support the chip type circuit elements 15 in the stacked state, and engaging portions 44b adapted to elastically engage the inner surfaces of the bore 32 and which serve to prevent the plug member 44 from falling under its own weight. A recess 44c is formed under the platform portion 44a. Guide grooves 44d which receive the ribs 33 respectively are formed in the outer surfaces of both the engaging portions 44b. Thus, the plug member 44 is smoothly guided within the bore 32 by means of the ribs 33 disposed in the bore 32, and the circuit elements 15 stacked on the platform portion 44a of the plug member 44 are smoothly supplied from the magazine 30 one-by-one by the operation of the thrust pin 23A.

It is favorable for both the plug members 34 and 44 above described to be molded from a resin which is softer than the material of the ribs 33 inside the magazine 30.

As set forth above, the magazine 30 of the present embodiment for storing and supplying circuit elements have the ribs 33 disposed in the bore 32 of the rectangular tube 31. In this manner, it is possible to absorb or nullify any deviations in the length dimensions of the chip type circuit elements 15, with the result that the chip type circuit elements 15 are reliably prevented from being wedged one another which would hamper the supply thereof. In addition, when the guide grooves 44d corresponding to the ribs 33 are formed in the engaging portions 44b of the plug member 44, a still smoother supply of the circuit elements becomes possible.

It will be understood by one skilled in the art that the number and shape of the ribs 33 and the number and shape of the guide grooves of the engaging portions of the plug member formed so as to correspond to the ribs can be appropriately altered.

Obviously, numerous modification and variations of the present invention are possible in the light of the above teachings. It is therefore to be understood that within the scope of the claims appended hereto, the invention may be practiced otherwise than as specifically disclosed herein.

What is claimed is:

1. In a magazine for storing and supplying circuit elements having a tube which stores the plurality of circuit elements in a stacked state within a bore thereof, the tube having an open upper discharge end, the bore being adapted to receive a plug member so as to be movably disposed within the bore for supporting the stacked circuit elements, the improvement comprising:
    an elastic member provided at one side of a region of the upper discharge end of said tube, said elastic member having a free end, and a keeper pawl formed at the free end of said elastic member extending inwardly into the bore for holding under pressure a leading one of the circuit elements within said bore, said keeper pawl having a free end which is located lower than the discharge end of said tube;
    said bore being defined by inner surfaces of said tube, at least one of said inner surfaces having at least one inwardly protruding rib which extends continuously in a longitudinal direction; and
    a plug member including a platform portion adapted to support the circuit elements from below in a stacked state and engaging portions integral with said platform portion, said engaging portions elastically engaging the inner surfaces of said tube so that said plug member is prevented from falling within said tube under its own weight;
    whereby the circuit elements can be discharged from the upper discharge end in an axial direction.

2. A magazine for storing and supplying circuit elements as defined in claim 1 wherein said keeper pawl is partially defined by a surface which extends inwardly into said bore in a direction towards the supply end of said tube.

3. A magazine for storing and supplying circuit elements as defined in claim 1 wherein a pair of said ribs are formed on each of a pair of opposed bore defining surfaces of the tube.

4. A magazine for storing and supplying circuit elements as recited in claim 1 wherein said engaging portions are formed with at least one guide groove which receive corresponding ones of said ribs in said tube.

5. A magazine for storing and supplying circuit elements as recited in claim 1 wherein said bore has a rectangular cross-section defined by two opposed pairs of inner surfaces, and wherein said elastic member has an inner surface which forms one of the four inner surfaces defining said bore at the region of the upper supply end of the tube.

* * * * *